United States Patent
Mei et al.

(10) Patent No.: US 9,385,269 B2
(45) Date of Patent: Jul. 5, 2016

(54) SEMICONDUCTOR EPITAXIAL STRUCTURE AND LIGHT-EMITTING DEVICE THEREOF

(71) Applicant: South China Normal University, Guangzhou (CN)

(72) Inventors: Ting Mei, Guangzhou (CN); Naiyin Wang, Guangzhou (CN); Hao Li, Guangzhou (CN); Lei Wan, Guangzhou (CN)

(73) Assignee: SOUTH CHINA NORMAL UNIVERSITY, Guangzhou (CN)

( * ) Notice: Subject to any disclaimer, the term of this patent is extended or adjusted under 35 U.S.C. 154(b) by 136 days.

(21) Appl. No.: 14/130,624

(22) PCT Filed: Dec. 26, 2012

(86) PCT No.: PCT/CN2012/001740
§ 371 (c)(1),
(2) Date: Jan. 2, 2014

(87) PCT Pub. No.: WO2014/082192
PCT Pub. Date: Jun. 5, 2014

(65) Prior Publication Data
US 2015/0340551 A1    Nov. 26, 2015

(30) Foreign Application Priority Data

Nov. 30, 2012 (CN) .......................... 2012 1 0507475

(51) Int. Cl.
| | |
|---|---|
| *H01L 33/06* | (2010.01) |
| *H01L 33/14* | (2010.01) |
| *H01S 5/343* | (2006.01) |
| *H01S 5/042* | (2006.01) |

(52) U.S. Cl.
CPC .............. *H01L 33/06* (2013.01); *H01L 33/14* (2013.01); *H01L 33/145* (2013.01); *H01S 5/0421* (2013.01); *H01S 5/34333* (2013.01); *H01S 5/34346* (2013.01)

(58) Field of Classification Search
CPC ........ B82Y 20/00; H01L 33/32; H01L 33/06; H01L 33/007; H01L 33/08
See application file for complete search history.

(56) References Cited

U.S. PATENT DOCUMENTS

| 2007/0272936 A1 | 11/2007 | Shin | |
|---|---|---|---|
| 2008/0149918 A1* | 6/2008 | Yoo .......................... | H01L 33/32 257/17 |

(Continued)

FOREIGN PATENT DOCUMENTS

| CN | 1856915 | 11/2006 |
|---|---|---|
| CN | 102136536 A | 7/2011 |

(Continued)

OTHER PUBLICATIONS

International Search Report for Application No. PCT/CN2012/001740 dated Sep. 5, 2013.

*Primary Examiner* — Michelle Mandala
(74) *Attorney, Agent, or Firm* — Chieh-Mei Wang

(57) ABSTRACT

The present invention discloses an epitaxial structure for semiconductor light-emitting device, comprising an electron injection region, a hole injection region, a multi-quantum well active region, a potential barrier layer for blocking carriers, and one or more band edge shaping layers. The doping type and/or doping concentration of said band edge shaping layers are different from those of the adjacent layers. It may trim the band edge shape of the semiconductor energy band through the local built-in electric field formed as a result of adjusting the doping type, doping concentration and/or layer thickness thereof, such that the carriers in the multi-quantum well active region are distributed uniformly, the overall Auger recombination is decreased, and the effective potential barrier height of the potential barrier layer for blocking carriers is increased to reduce the drain current formed by carriers overflowing out of the multi-quantum well active region, thereby improving internal quantum efficiency. The present invention further discloses a semiconductor light-emitting device that employs said epitaxial structure, which similarly achieves the effects of reduced Auger recombination and/or decreased drain current through the trimming of the band edge shape of the energy band structure by the local built-in electric field, thereby improving internal quantum efficiency of the device.

7 Claims, 10 Drawing Sheets

(56) References Cited

U.S. PATENT DOCUMENTS

2010/0187496 A1\* 7/2010 Yan .................... H01L 33/32
 257/13
2011/0188528 A1 8/2011 Kisin et al.

FOREIGN PATENT DOCUMENTS

| CN | 102185058 A | 9/2011 |
| TW | 201027809 A | 7/2010 |

\* cited by examiner

SEMICONDUCTOR EPITAXIAL STRUCTURE AND LIGHT-EMITTING DEVICE THEREOF

CROSS-REFERENCE TO RELATED APPLICATIONS

The present application is a national phase entry under 35 U.S.C. §371 of International Application No. PCT/CN2012/001740, filed Dec. 26, 2012, which claims priority from Chinese Application CN201210507475.0, filed Nov. 30, 2012, all of which are incorporated herein by reference.

FIELD OF THE INVENTION

The present invention relates to the technical field of semiconductor light-emitting devices and specifically to an epitaxial structure that uses local built-in electric field to trim the energy band structure so as to improve internal quantum efficiency. The present invention further relates to semiconductor light-emitting devices that employ said epitaxial structure.

DESCRIPTION OF THE PRIOR ART

Semiconductor light-emitting devices typically include semiconductor laser diodes (LD) and semiconductor light-emitting diode (LED). A carrier injection region includes electron injection region and hole injection region. A multi-quantum well active region is a periodic structure formed by alternately stacked quantum well layers and barrier layers, and electrons and holes are recombined in the quantum well layer to produce photons. A potential barrier layer for blocking carriers is disposed between a multi-quantum well active region and a carrier injection region such that the conduction band or valence band at this location has a relatively high potential energy.

Research has shown that the internal quantum efficiency of a semiconductor light-emitting device has a close relationship with several mechanisms described below: Auger recombination, carrier leakage, nonuniform distribution of carriers in multi-quantum well active regions, effect of the polarization field, junction heating and limited hole transport. However, which specific effect is more prominent has not been determined.

According to the above mechanisms, methods to improve the internal quantum efficiency of a semiconductor light-emitting device primarily include reducing the leakage of carriers, improving the distribution uniformity of carriers in multi-quantum well active regions, reducing Auger recombination, etc. Researchers have also proposed many improvement methods, for example, using a thin film of a wide bandgap material, AlInN, that matches the GaN crystal lattice as the barrier; inserting a layer of p-InGaN between a multi-quantum well active region and an electron blocking layer (EBL) as the hole storage layer to improve the hole injection efficiency; using a wide bandgap material, AlInN, to take the place of AlGaN as the electron blocking layer; using InGaN or GaN—InGaN—GaN or InGaN—AlGaN—InGaN to take the place of GaN as the barrier, etc.

The above methods to improve the internal quantum efficiency of a semiconductor light-emitting device are usually specific to certain devices or structures with very limited applications; in addition, some methods still have many problems in urgent need to be solved. For example, using a thin film of the wide bandgap material, AlInN, as the barrier of a multi-quantum well active region has low crystal quality as impacted by the current level of epitaxial growth, which limits the improvement of the device's photoelectric properties.

SUMMARY OF THE INVENTION

The first object of the present invention is to provide an epitaxial structure for improving the internal quantum efficiency of a semiconductor light-emitting device, which introduces a band edge shaping layer to a specific position of the epitaxial structure, uses the local built-in electric field generated thereby to trim the band edge shape of the semiconductor energy band of the epitaxial structure and to improve the internal quantum.

The second object of the present invention is to provide a semiconductor light-emitting device with improved internal quantum efficiency, which introduces a band edge shaping layer to a specific position of the epitaxial structure, uses the local built-in electric field generated thereby to trim the band edge shape of the energy band and to improve the internal quantum efficiency of the device.

The technical solution employed to attain the first object of the present invention:

An epitaxial structure for semiconductor light-emitting device, comprising an electron injection region, a multi-quantum well active region and a hole injection region, as well as one or more band edge shaping layers; the doping type and/or doping concentration of said band edge shaping layers are different from those of the adjacent layers, said doping type being non-doping, P-type doping or N-type doping; the band edge shaping layer trims the band edge shape of a semiconductor energy band of the epitaxial structure through the local built-in electric field formed as a result of adjusting the doping type, doping concentration and/or layer thickness thereof; the band edge shaping layer is disposed between the electron injection region and the multi-quantum well active region to adjust the position of electron ground state level of quantum wells in the multi-quantum well active region relative to the quasi fermi level such that the distribution of carrier concentration in the quantum well layer inside the multi-quantum well active region becomes uniform and the overall Auger recombination is decreased; alternatively, it further comprises a potential barrier layer for blocking carriers, the potential barrier layer are disposed together with the band edge shaping layer between the hole injection region and the multi-quantum well active region; when one side or two sides of the potential barrier layer are provided with the band edge shaping layer, the band edge shaping layer increases the effective potential barrier height of the potential barrier layer and reduces carrier leakage; alternatively, the band edge shaping layer is disposed inside the barrier layer of the multi-quantum well active region; alternatively, the band edge shaping layer is disposed inside the electron injection region or the hole injection region.

The present invention has the following advantageous effects: a band edge shaping layer is introduced to a specific position of the epitaxial structure of a semiconductor light-emitting device, the local built-in electric field formed as a result of the difference between the doping type and/or doping concentration of said band edge shaping layers and those of the adjacent layers thereof is used to trim the band edge shape of the adjacent energy band structure such that the energy band structure is bent, the position of the electron ground state level of quantum wells in the multi-quantum well active region relative to the quasi fermi level at the side close to the electron injection region is decreased, and the injection of carriers is improved. As a result, the carrier distribution in the quantum well layer inside the multi-quantum well active region is uniform and the overall Auger recombination is decreased; the effective potential barrier height of the potential barrier layer for blocking carriers may also be increased to reduce carrier leakage. As indicated by the research, the introduction of a band edge shaping layer to different positions has different action mechanisms, but all improve the internal quantum efficiency of the device based on the principle that a local built-in electric field is used to trim the band edge shape of the semiconductor energy band of the epitaxial structure.

The doping type and/or doping concentration of the band edge shaping layers are different from those of the adjacent layers, which may be non-doping, P-type doping or N-type doping, and the band edge shape of a semiconductor energy band is trimmed through the local built-in electric field formed as a result of adjusting the doping type, doping concentration and/or layer thickness thereof.

Preferably, the band edge shaping layer trims the band edge shape of the semiconductor energy band of the epitaxial structure through the local built-in electric field formed as a result of adjusting the doping type, doping concentration and/or layer thickness thereof.

The band edge shaping layer adjusts the position of the electron ground state level of quantum wells in the multi-quantum well active region relative to the quasi fermi level such that the distribution of carrier concentration in the quantum well layer inside the multi-quantum well active region becomes uniform and the overall Auger recombination is decreased.

When the band edge shaping layer is disposed between the electron injection region and the multi-quantum well active region, the band edge shape of the adjacent energy band structure is trimmed to bend through the local built-in electric field formed as a result of adjusting the doping type, doping concentration and/or layer thickness thereof, the position of the electron ground state level of quantum wells in the multi-quantum well active region relative to the quasi fermi level at the side close to the electron injection region is decreased, and the injection of carriers is improved such that the distribution of carriers in quantum wells of the multi-quantum well active region becomes more uniform, thereby decreasing the overall Auger recombination.

Preferably, when the band edge shaping layer is disposed between the electron injection region and the multi-quantum well active region, the band edge shaping layer makes the electron ground state level of quantum wells in the multi-quantum well active region to be decreased relative to the quasi fermi level; the farther a quantum well is away from the band edge shaping layer, the less its electron ground state level is decreased relative to the quasi fermi level.

Preferably, when there are a plurality of band edge shaping layers, they are disposed at both sides of the multi-quantum well active region at the same time, specifically: disposed between the electron injection region and the multi-quantum well active region and disposed together with the potential barrier layer for blocking carriers between the multi-quantum well active region and the hole injection region.

Preferably, when there are a plurality of band edge shaping layers, they are all disposed at the same side of the multi-quantum well active region, specifically: disposed between the multi-quantum well active region and the hole injection region, each band edge shaping layer having a different doping type, doping concentration and/or layer thickness.

Preferably, when there are a plurality of band edge shaping layers, they are all disposed at the same side of the multi-quantum well active region, specifically: disposed between the multi-quantum well active region and the hole injection region, each band edge shaping layer having a different doping type, doping concentration and/or layer thickness; further comprising a potential barrier layer for blocking carriers disposed between the carrier injection region and the multi-quantum well active region.

In the above preferred solutions, when a band edge shaping layer is disposed between the multi-quantum well active region and the hole injection region, a potential barrier layer for blocking carriers is present at the same time, and said potential barrier layer is also disposed between the multi-quantum well active region and the hole injection region.

Preferably, when the band edge shaping layer is disposed together with the potential barrier layer for blocking carriers between the multi-quantum well active region and the hole injection region, the band edge shape of the energy band structure of the potential barrier layer for blocking carriers is trimmed through the local built-in electric field formed as a result of adjusting the doping type, doping concentration and/or layer thickness of said band edge shaping layer to change the position of the conduction band relative to the quasi fermi level, increase the effective potential barrier height of the potential barrier layer for blocking carriers, and reduce electron leakage.

Preferably, when P-type doping is used, the doping concentration is $1\times10^{17}$ cm$^{-3}$~$5\times10^{18}$ cm$^{-3}$; the thickness of the band edge shaping layer is 1 nm~300 nm; when N-type doping is used, the doping concentration is $1\times10^{17}$ cm$^{-3}$~$1\times10^{19}$ cm$^{-3}$; the thickness of the band edge shaping layer is 1 nm~100 nm.

Preferably, when the band edge shaping layer is disposed together with a potential barrier layer for blocking carriers between the multi-quantum well active region and the hole injection region, the potential barrier layer for blocking carriers is disposed between the band edge shaping layer and the multi-quantum well active region or disposed between the band edge shaping layer and the hole injection region; the preferred thickness of the band edge shaping layer is 1 nm~300 nm.

When there are multiple layers of the band edge shaping layer and two action mechanisms simultaneously, the two effects of overall Auger recombination reduction and carrier leakage reduction can be achieved simultaneously.

The following seven technical solutions are employed to attain the second object of the present invention. All of the following technical solutions are semiconductor light-emitting devices made by applying the above epitaxial structure:

Solution I: at least comprising an electron injection region, a band edge shaping layer, a multi-quantum well active region and a hole injection region that are arranged sequentially.

Solution II: at least comprising an electron injection region, a multi-quantum well active region, a band edge shaping layer, a potential barrier layer for blocking carriers and a hole injection region that are arranged sequentially.

Solution III: at least comprising two band edge shaping layers, which are the first band edge shaping layer and the second band edge shaping layer, respectively; the epitaxial structure of said semiconductor light-emitting device at least comprises an electron injection region, the second band edge shaping layer, a multi-quantum well active region, the first band edge shaping layer, a potential barrier layer for blocking carriers and a hole injection region that are arranged sequentially.

Solution IV: at least comprising two band edge shaping layers, which are the first band edge shaping layer and the second band edge shaping layer, respectively; the first band edge shaping layer is N-type doped and the second band edge shaping layer is P-type doped; the epitaxial structure of said semiconductor light-emitting device at least comprises an electron injection region, a multi-quantum well active region, a potential barrier layer for blocking carriers, the second band edge shaping layer, the first band edge shaping layer and a hole injection region that are arranged sequentially.

Solution V: at least comprising an electron injection region, a multi-quantum well active region and a hole injection region that are arranged sequentially; further comprising a band edge shaping layer that is disposed inside the barrier layer of the multi-quantum well active region.

Solution VI: at least comprising an electron injection region, a multi-quantum well active region and a hole injection region that are arranged sequentially; further comprising a band edge shaping layer that is disposed inside the electron injection region.

Solution VII: at least comprising an electron injection region, a multi-quantum well active region and a hole injection region that are arranged sequentially; further comprising a band edge shaping layer that is disposed inside the hole injection region.

The present invention introduces a band edge shaping layer to a specific position of the epitaxial structure of a semiconductor light-emitting device, the band edge shaping layer trims the band edge shape of the semiconductor energy band of the epitaxial structure through the local built-in electric field formed as a result of adjusting the doping type, doping concentration and/or layer thickness thereof; the local built-in electric field acts on the adjacent energy band structure such that the energy band structure is bent, which can decrease the position of the electron ground state level of quantum wells in the multi-quantum well active region relative to the quasi fermi level at the side close to the electron injection region, improve the injection of carriers, balance the distribution of carriers in quantum wells of the multi-quantum well active region, and decrease the overall Auger recombination; it may also increase the effective potential barrier height of the potential barrier layer for blocking carriers, reduce carrier leakage, and ultimately improve the internal quantum efficiency of the device.

Relative to the drawbacks of the prior art, the present invention provides a new idea to solve the problems, which attains the goal of improving the internal quantum efficiency of a device by using the local built-in electric field to trim the band edge shape of the energy band of the semiconductor epitaxial structure, and the disclosed epitaxial structure can be extensively used in the field of semiconductor light-emitting devices, including the fields of LED and semiconductor laser diodes. Moreover, semiconductor light-emitting devices made with said epitaxial structure have impact on a number of aspects, including Auger recombination and carrier leakage such that the internal quantum efficiency of the devices is improved significantly.

Processes according to the prior art for manufacturing the epitaxial structure and semiconductor light-emitting devices of the present invention are relatively mature. During epitaxial growth, a band edge shaping layer grows through chemical vapor deposition of metal organic compounds, and subsequently a semiconductor light-emitting device is made.

DETAILED DESCRIPTION OF SPECIFIC EMBODIMENTS

Figure 1:
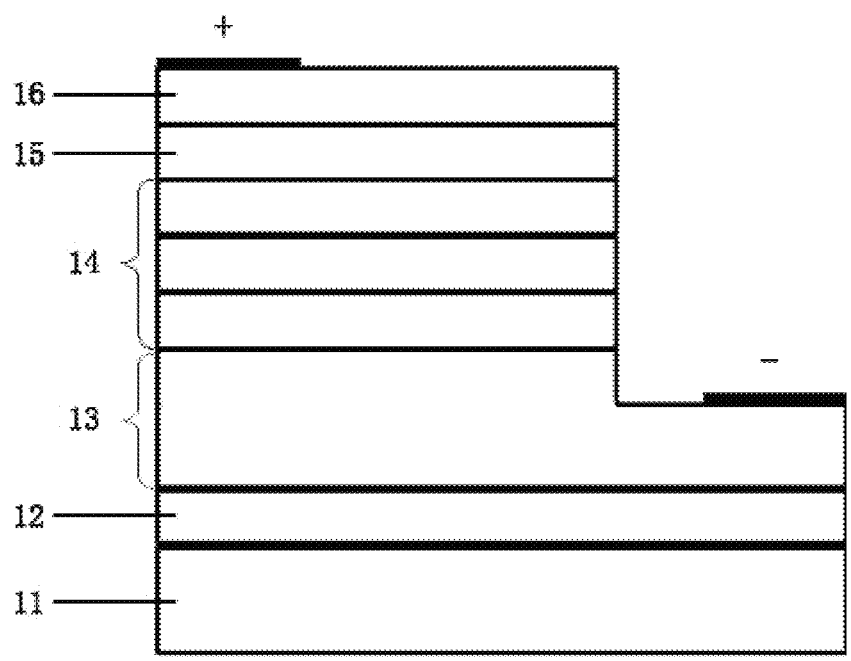
FIG. 1 illustrates the epitaxial structure of a light-emitting diode according to the prior art

Specific embodiments of the present invention will be further described below with reference to the accompanying drawings:

FIG. 1 illustrates the epitaxial structure of a light-emitting diode according to the prior art.

In the epitaxial structure of a light-emitting diode (LED), the N-type electron injection layer is the electron injection region, the P-type hole injection layer is the hole injection region, and the electron blocking layer is the potential barrier layer for blocking carriers.

The epitaxial structure of a light-emitting diode in FIG. 1 comprises sequentially from bottom up: a substrate layer 11, a nucleation layer 12, a N-type electron injection layer 13, a multi-quantum well active region 14, an electron blocking layer (EBL) 15 and a P-type hole injection layer 16, wherein, The structure of the N-type electron injection layer 13: the thickness is 3 μm, the material is n-GaN, and the doping concentration is $5\times10^{18}$ cm$^{-3}$;

The structure of the N multi-quantum well active region 14: comprising a number of quantum well layers and corresponding quantum well barrier layers thereof, this example comprises 6 quantum well barrier layers and 5 quantum well layers, wherein the thickness of the quantum well barrier layers is 15 nm, and the material is GaN; the thickness of the quantum well layers is 3 nm, and the material is $In_{0.11}Ga_{0.89}N$;

The structure of the P-type hole injection layer 16: the thickness is 0.2 μm, the material is p-GaN, and the doping concentration is $7\times10^{17}$ cm$^{-3}$.

The epitaxial material of the above light-emitting diode according to the prior art is primarily a GaN-based material. In addition, common epitaxial materials for semiconductor light-emitting devices (including LED and LD) according to the prior art further comprise: InN, AlN, InGaN, AlGaN, AlInN, AlInGaN, GaP, GaAsP, GaAs, AlAs, AlGaAs, InP, AlP, AlInP, GaInP, AlGaP, AlGaInP, AlSb, InGaAs, InAs, InSb, GaSb, AlAsSb, AlInAs, InAsP, InGaAsP, AlGaSb, AlInSb, InGaSb, GaAsSb, CdS, ZnSe, ZnCdSe, ZnMgSeS, AlGaAsSb, InGaAsSb and InGaNAs etc.

Currently, laser includes solid laser, gas laser, liquid laser, semiconductor laser and free electron laser. For semiconductor laser, its common epitaxial structure is partially similar to the epitaxial structure of a light-emitting diode, comprising substantially consistent electron injection regions, multi-quantum well active regions and hole injection regions; both can introduce a band edge shaping layer to a specific position of the epitaxial structure and trim the band edge shape of the semiconductor energy band through the local built-in electric field formed thereof to achieve the improvement of the internal quantum efficiency of the device.

The light-emitting diode shown in FIG. 1 further comprises positive and negative electrodes.

Figure 3:
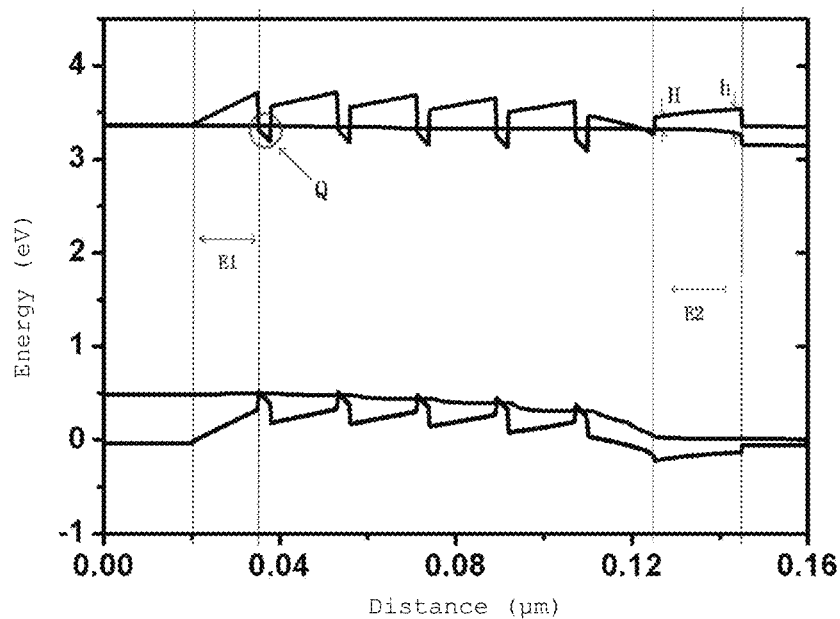
FIG. 3 illustrates the energy band structure of the light-emitting diode according to the prior art in FIG. 1.

FIG. 3 illustrates the energy band structure of the light-emitting diode in FIG. 1.

The above structure of layers of the light-emitting diode chip according to the prior art is similarly applicable to the epitaxial layer structure according to the present invention, because said epitaxial structure is the foundation to make light-emitting diode chip and its structure of layers has been confirmed when the epitaxial structure is formed.

Therefore, the following examples of light-emitting diode chip structures are in essence examples of the epitaxial structure according to the present invention relating to light-emitting diode and semiconductor laser.

EXAMPLE I

Figure 2:
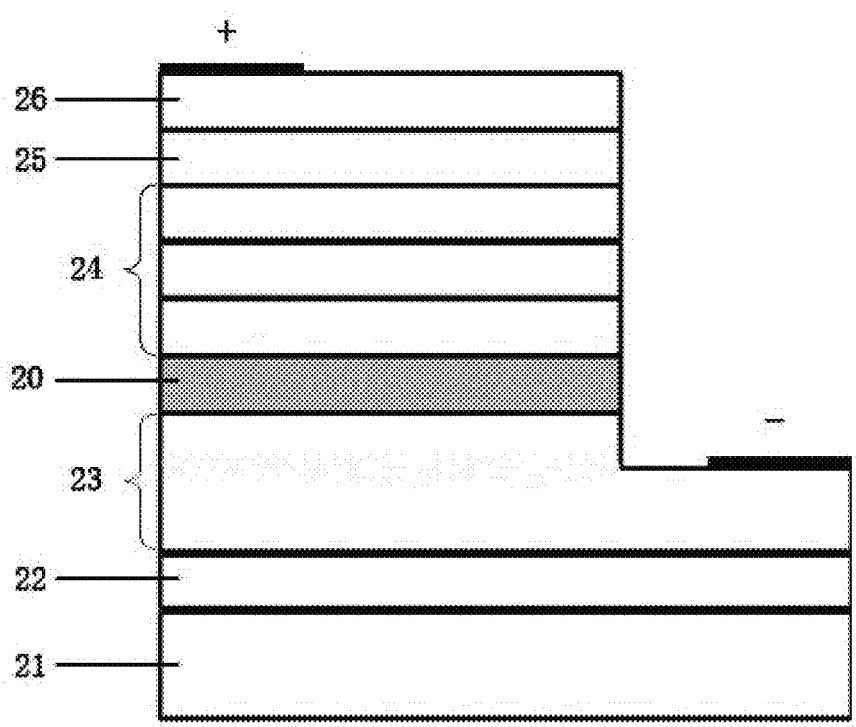
FIG. 2 illustrates the epitaxial structure of a light emitting diode in Example I of the present invention.

As shown in FIG. 2, the epitaxial structure of the light-emitting diode comprises sequentially from bottom up: a substrate layer 21, a nucleation layer 22, a N-type electron injection layer 23, a band edge shaping layer 20, a multi-quantum well active region 24, an electron blocking layer 25 and a P-type hole injection layer 26. Relative to the prior art, the band edge shaping layer 20 is introduced between the N-type electron injection layer 23 and the multi-quantum well active region 24.

The thickness of the band edge shaping layer 20 is 1 nm~100 nm, the material is P-type doped GaN, the doping concentration is $1\times10^{17}$ cm$^{-3}$~$5\times10^{18}$ cm$^{-3}$, and the dopant is Cp$_2$Mg.

In this example, one most preferred selection is: the thickness of the band edge shaping layer 20 is 20 nm and the doping concentration is $5\times10^{17}$ cm$^{-3}$. The inventors have shown through actual tests that when it is the n-type doping or un-doping, and when the thickness is not 20 nm, the result is still optimized relative to not inserting said layer, but the effect is not as good as that of the above most preferred selection.

Figure 4:
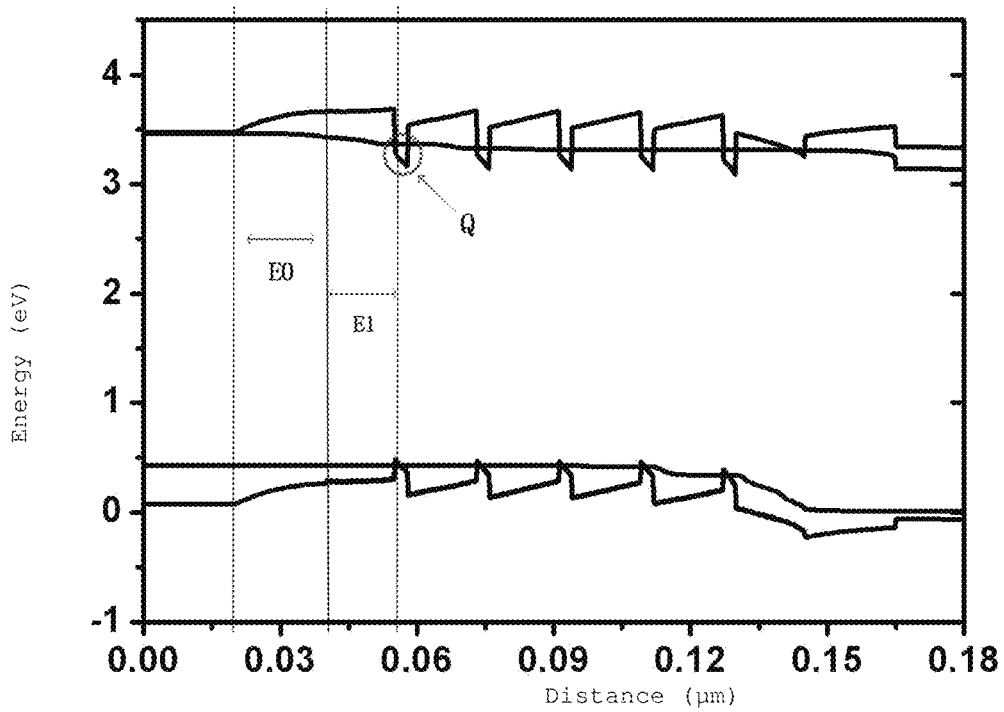
FIG. 4 illustrates the energy band structure of the example in FIG. 2.
Figure 5:
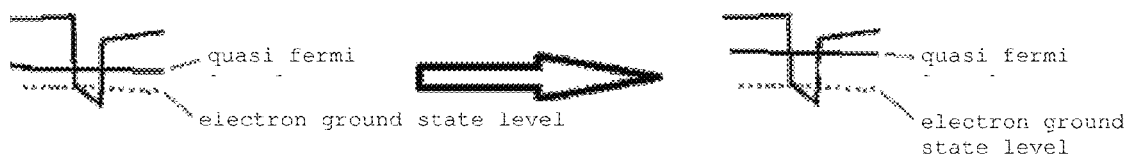
FIG. 5 illustrates the enlarged comparison of the quantum wells Q in FIG. 3 and FIG. 4.

FIG. 4 illustrates changes to the energy band structure when the most preferred solution is selected in this example (the thickness of the band edge shaping layer is 20 nm and the doping concentration is $5\times10^{17}$ cm$^{-3}$). In FIG. 3 and FIG. 4, E1 represents the energy band structure of the quantum well barrier layer in the multi-quantum well active region adjacent to the band edge shaping layer, E0 in FIG. 4 represents the energy band structure of the band edge shaping layer, and it can be seen by comparing the E1 energy band regions in FIG. 3 and FIG. 4 that:

When the band edge shaping layer is introduced, the band edge shape of the energy band of the quantum well barrier layer in the multi-quantum well active region adjacent to the band edge shaping layer is trimmed through the local built-in electric field formed thereby such that it is bent; as a whole, the slope of the conduction band of the band edge shaping layer and the adjacent quantum well barrier layer becomes less steep and the effective potential barrier height is decreased, which is more favorable for the injection of carriers; as acted by the local built-in electric field, moreover, the position of electron ground state level of quantum wells at the side close to the band edge shaping layer relative to the quasi fermi level is also impacted. The first quantum well Q is observed as shown in FIG. 5, its left side is the quantum well in FIG. 3, and its right side is the quantum well in FIG. 4. Compared with the left side, the position of electron ground state level in the quantum well at the right side is lower relative to the quasi fermi level, indicating that more electrons are captured by said quantum well and the carrier concentration in said quantum well is increased. The farther a quantum well is away from the band edge shaping layer, the weaker the impact of the local built-in electric field is and the less the electron ground state level in the quantum well is decreased relative to the quasi fermi level. This shows that relative to the structure prior to the optimization, the carrier distribution in the quantum well of the multi-quantum well active region in the light-emitting diode of this example is more uniform.

Figure 6A:
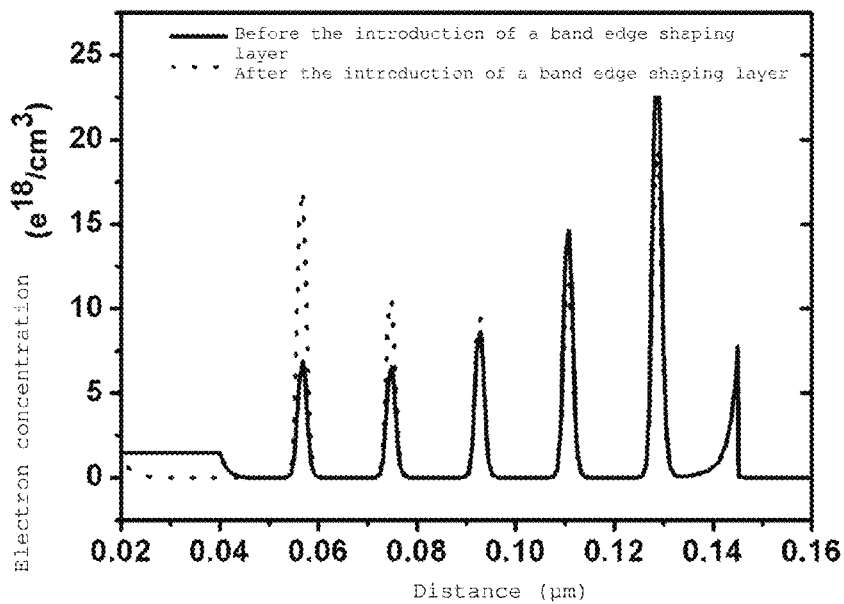
FIG. 6(a) illustrates the electron concentration distribution of the multi-quantum well active region in the example in FIG. 2.
Figure 6B:
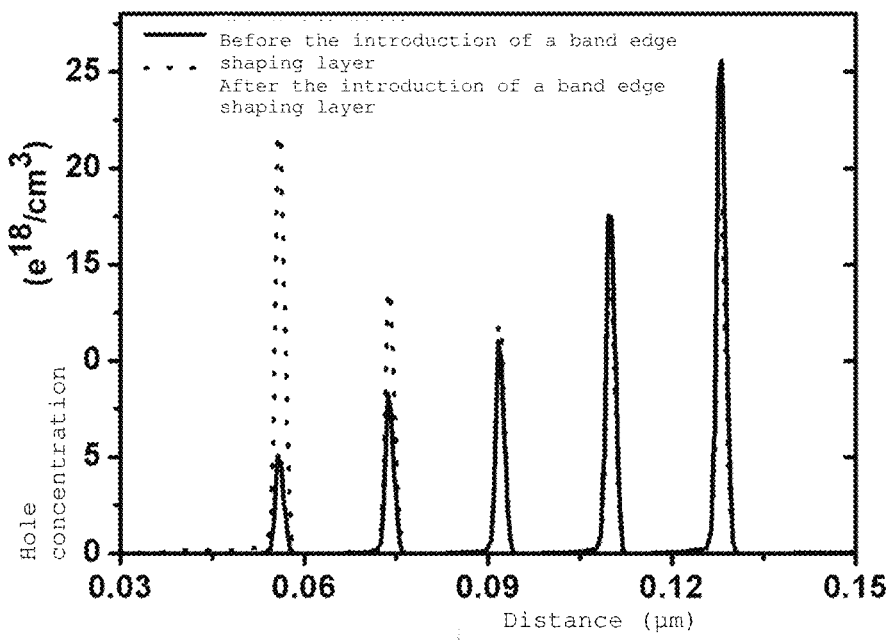
FIG. 6(b) illustrates the hole concentration distribution of the multi-quantum well active region in the example in FIG. 2.

FIG. 6(a) and FIG. 6(b) illustrate the electron and hole concentration distribution in the multi-quantum well active region in the most preferred solution of this example. It can be seen from the figures that when the carrier distributions in quantum wells of the multi-quantum well active region before and after the introduction of a band edge shaping layer are compared, the carrier distribution after the introduction of the band edge shaping layer is more uniform, the overall Auger recombination is decreased, and therefore the internal quantum efficiency of the device is improved.

Figure 7:
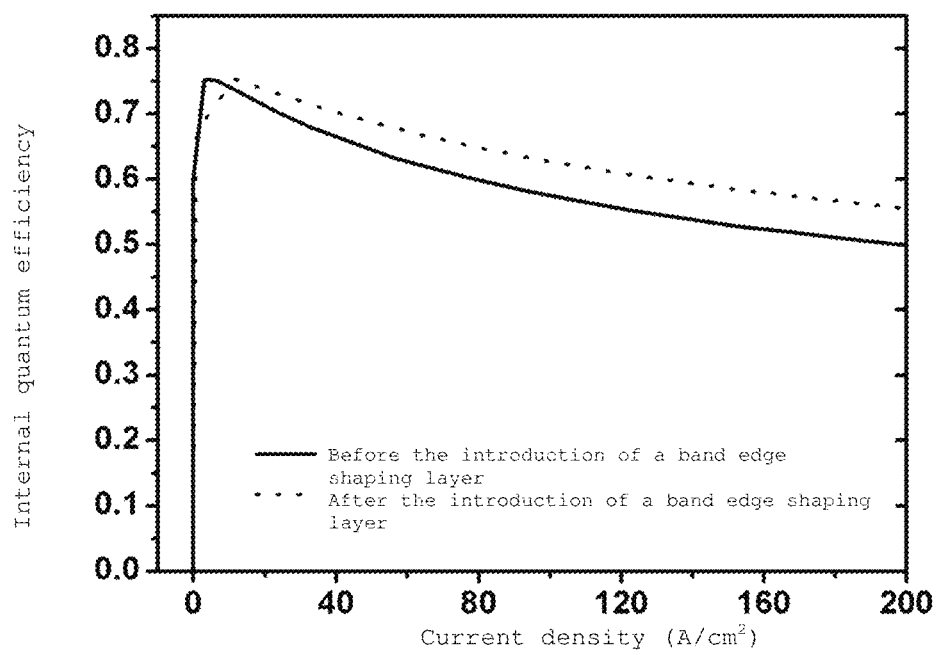
FIG. 7 illustrates the variation tendency of the internal quantum efficiency in the example in FIG. 2.

FIG. 7 illustrates the variation tendency of the internal quantum efficiency along with the current density in the most preferred solution of this example. When changes of the internal quantum efficiency before and after the introduction of a band edge shaping layer are compared, it can be seen that the internal quantum efficiency has been improved after the introduction of a band edge shaping layer, and the degree of the improvement of the internal quantum efficiency does not decrease along with the current increase.

EXAMPLE II

Figure 8:
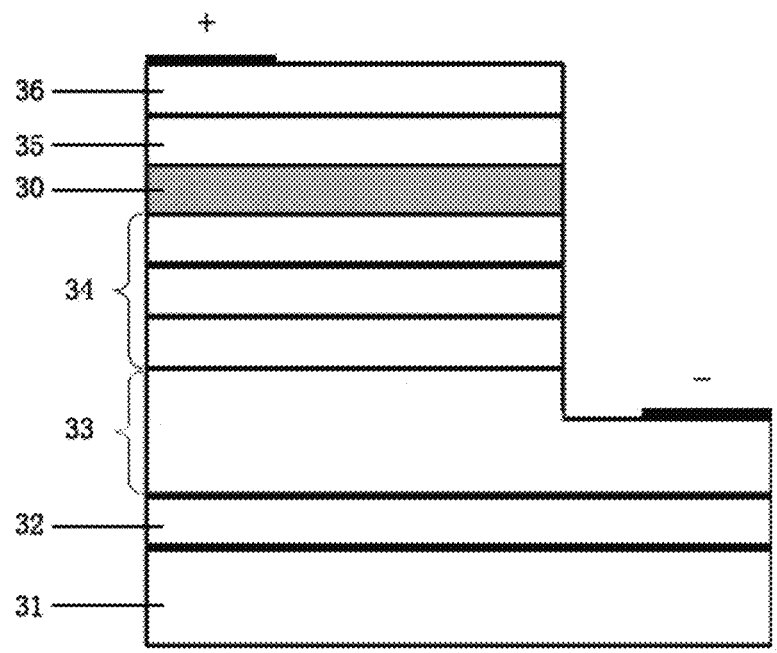
FIG. 8 illustrates the structure of a light-emitting diode in Example II of the present invention.

As shown in FIG. 8, the epitaxial structure of the light-emitting diode comprises sequentially from bottom up: a substrate layer 31, a nucleation layer 32, a N-type electron injection layer 33, a multi-quantum well active region 34, a band edge shaping layer 30, an electron blocking layer 35 and a P-type hole injection layer 36. Relative to the prior art, the band edge shaping layer 30 is introduced between the electron blocking layer 35 and the multi-quantum well active region 34.

The thickness of the band edge shaping layer 30 is 1 nm~300 nm, the material is P-type doped GaN, the doping concentration is $1\times10^{17}$ cm$^{-3}$~$5\times10^{18}$ cm$^{-3}$, and the dopant is Cp$_2$Mg.

In this example, one most preferred selection is: the thickness of the band edge shaping layer 30 is 50 nm and the doping concentration is $3\times10^{17}$ cm$^{-3}$. The inventors have shown through actual tests that when it is the n-type doping or un-doping, and when the thickness is not 50 nm, the result is still optimized relative to not inserting said layer, but the effect is not as good as that of the above most preferred selection.

Figure 9:
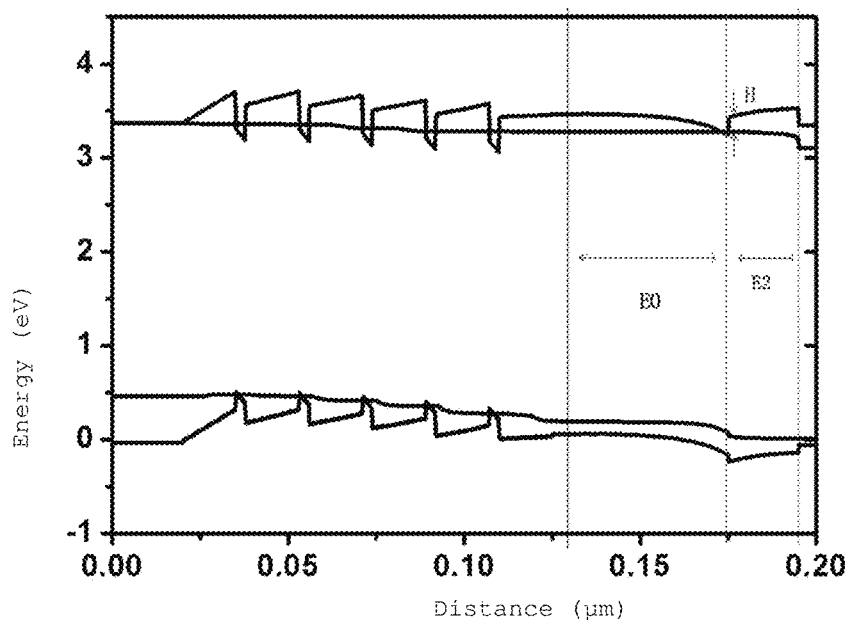
FIG. 9 illustrates the energy band structure of the example in FIG. 8.

FIG. 9 illustrates changes to the energy band structure when the most preferred solution is selected in this example. In FIG. 9, E0 represents the energy band structure of the band edge shaping layer, E2 represents the energy band structure of the electron blocking layer, and it can be seen by comparing the E0 and E2 energy band regions in FIG. 3 and FIG. 9 that:

When the band edge shaping layer is introduced, the band edge shape of the energy band at the location between the band edge shaping layer and the electron blocking layer is trimmed through the local built-in electric field formed thereby such that the conduction band of said region is bent upwardly. On one hand, the conduction band of the electron blocking layer is raised relative to the quasi fermi level, its effective potential barrier height is raised and the carrier leakage is reduced; on the other hand, the upward bending of the energy band of said local region also raises the conduction band at the interface between the band edge shaping layer and the electron blocking layer relative to the quasi fermi level, and reduces the aggregation of electrons at this position.

Figure 10:
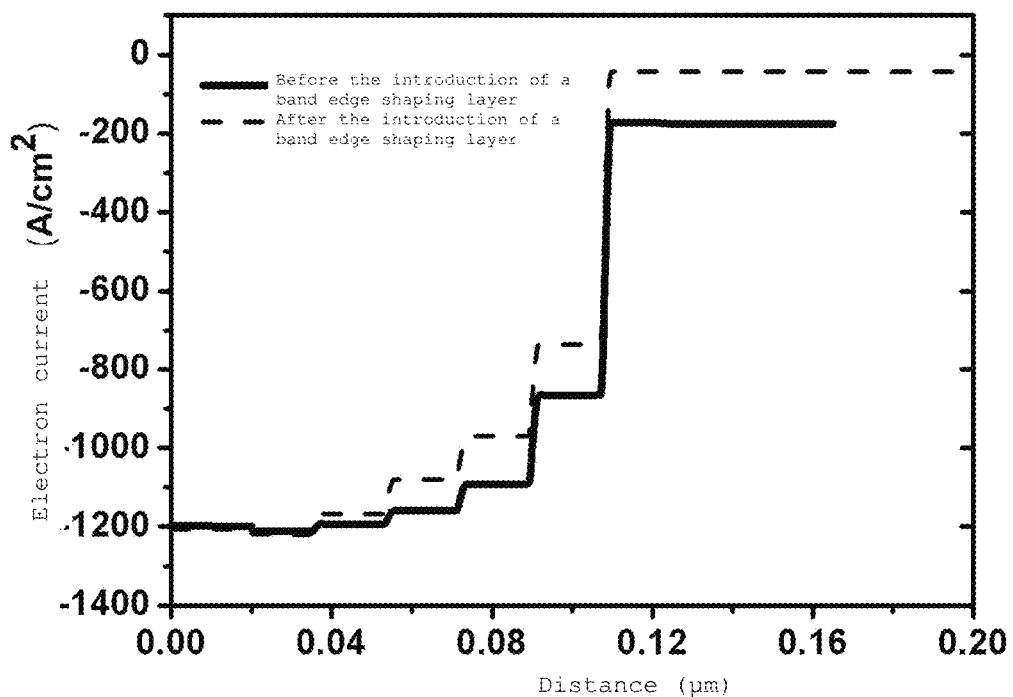
FIG. 10 illustrates the electron current distribution of the example in FIG. 8.

FIG. 10 illustrates changes of electron current along with the distance before and after the introduction of a band edge shaping layer in the most preferred solution. It can be seen from the figure that after the introduction of a band edge shaping layer, the drain current (electron leakage at this moment) is reduced.

Figure 11:
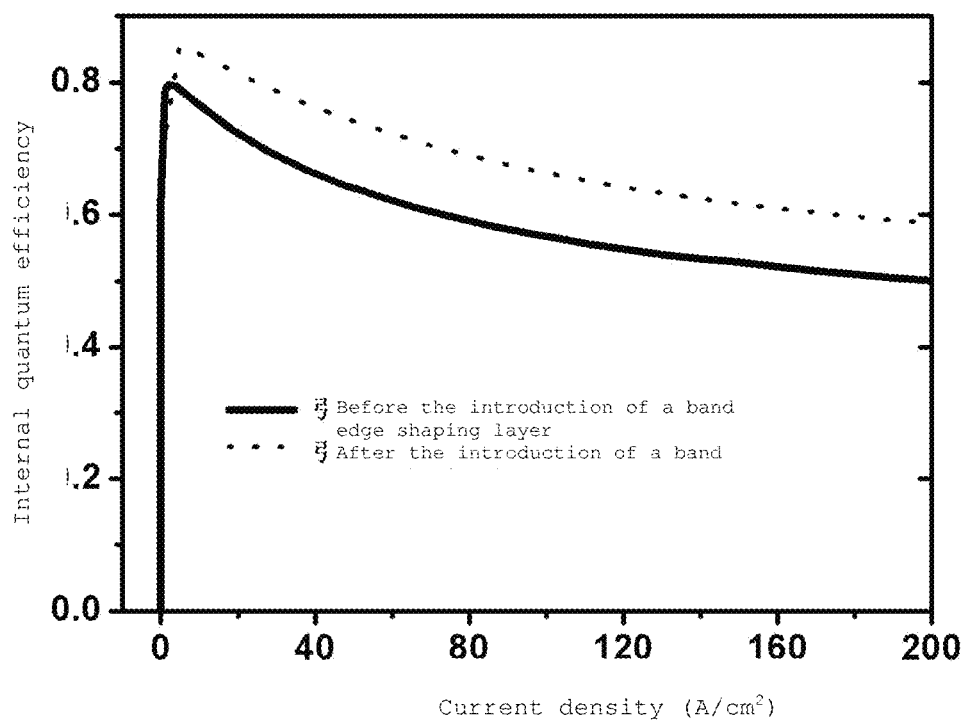
FIG. 11 illustrates the variation tendency of the internal quantum efficiency in the example in FIG. 8.

FIG. 11 illustrates the variation tendency of the internal quantum efficiency along with the current density in the most preferred solution of this example. When changes of the internal quantum efficiency before and after the introduction of a band edge shaping layer are compared, it can be seen that the internal quantum efficiency of the device has been improved after the introduction of a band edge shaping layer, and the degree of the improvement of the internal quantum efficiency does not decrease along with the current increase.

EXAMPLE III

Figure 12:
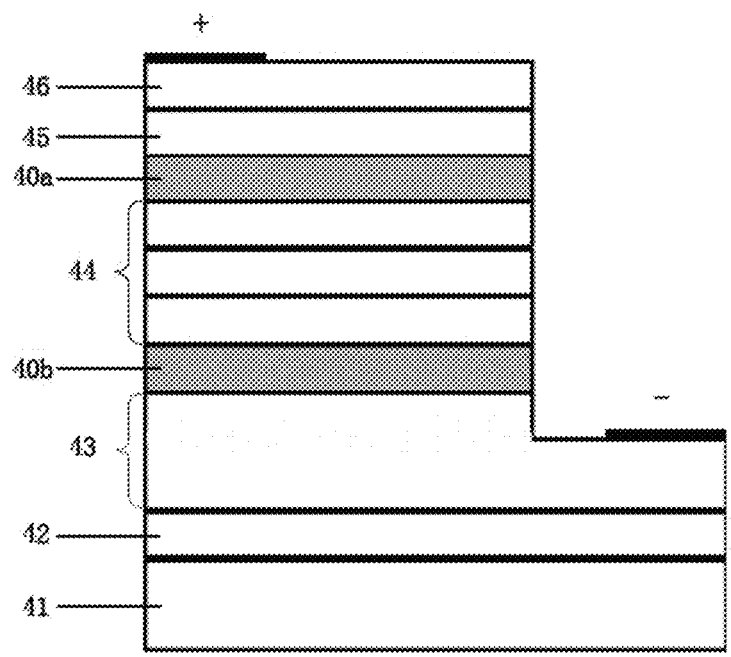
FIG. 12 illustrates the structure of a light-emitting diode in Example III of the present invention.

As shown in FIG. 12, the epitaxial structure of the light-emitting diode comprises sequentially from bottom up: a substrate layer 41, a nucleation layer 42, a N-type electron injection layer 43, a second band edge shaping layer 40*b*, a multi-quantum well active region 44, a first band edge shaping layer 40*a*, an electron blocking layer 45 and a P-type hole injection layer 46. Relative to the prior art, the second band edge shaping layer 40*b* is introduced between the N-type electron injection layer 43 and the multi-quantum well active region 44, and the first band edge shaping layer 40*a* is introduced between the electron blocking layer 45 and the multi-quantum well active region 44.

The thickness of the first band edge shaping layer 40*a* is 1 nm~300 nm, the material is P-type doped GaN, the doping concentration is $1\times10^{17}$ cm$^{-3}$~$5\times10^{18}$ cm$^{-3}$, and the dopant is Cp$_2$Mg. In this example, a preferred selection is that the thickness of the first band edge shaping layer 40*a* is 50 nm and the doping concentration is $3\times10^{17}$ cm$^{-3}$.

The thickness of the second band edge shaping layer 40*b* is 1 nm~100 nm, the material is N-type doped GaN, the doping concentration is $1\times10^{17}$ cm$^{-3}$~$1\times10^{19}$ cm$^{-3}$, and the dopant is SiH$_4$; alternatively, the material is P-type doped GaN, the doping concentration is $1\times10^{17}$ cm$^{-3}$~$5\times10^{18}$ cm$^{-3}$, and the dopant is Cp$_2$Mg. In this example, a preferred selection is that the thickness of the second band edge shaping layer 40*b* is 20 nm, the doping concentration is $8\times10^{17}$ cm$^{-3}$, and the dopant is SiH$_4$.

The inventors have shown through actual tests that when the doping type is different, the doping concentration is different or it is un-doping, and when the thickness changes, the result is still optimized relative to not inserting said layer, but the effect is not as good as that of the above preferred solution.

Figure 13:
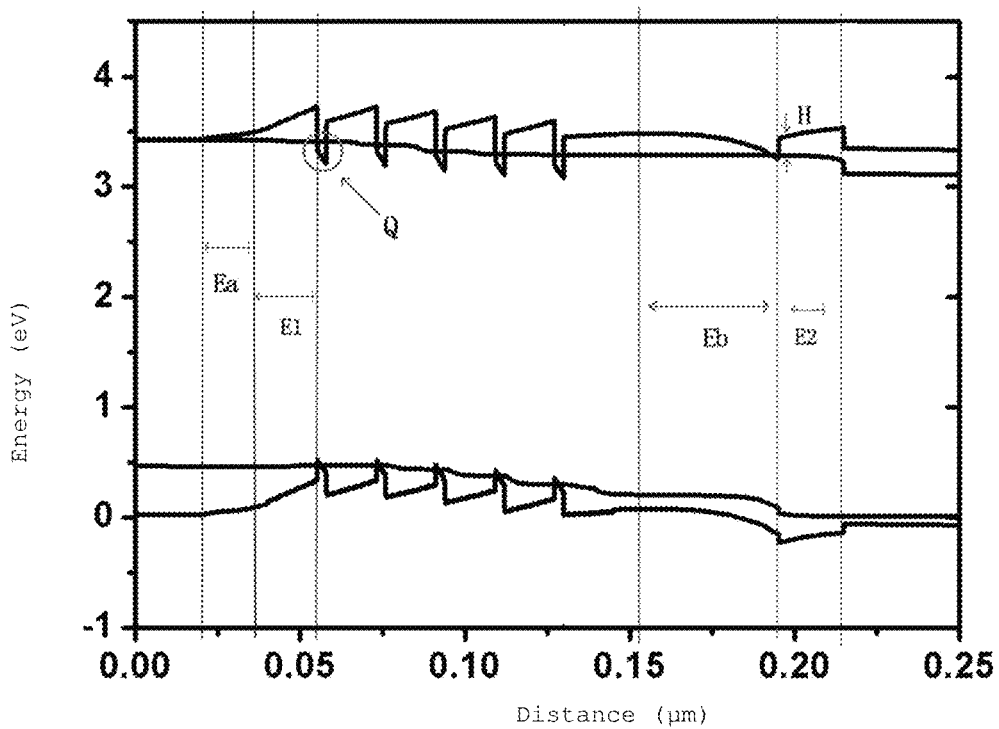
FIG. 13 illustrates the energy band structure of the example in FIG. 12.

FIG. 13 illustrates changes to the energy band structure when the preferred solution is selected in this example. In FIG. 3 and FIG. 13, E1 represents the energy band structure of the quantum well barrier layer in the multi-quantum well active region adjacent to the second band edge shaping layer, and E2 represents the energy band structure of the electron blocking layer. In FIG. 13, Ea represents the energy band structure of the second band edge shaping layer 40*b*, and Eb represents the energy band structure of the first band edge shaping layer 40*a*. It can be seen by comparing the E1 and E2 energy band regions in FIG. 3 and FIG. 13 that:

When the second band edge shaping layer 40*b* is introduced, the band edge shape of the E1 energy band region is trimmed through the local built-in electric field formed thereby such that the band edge shape of the energy band of the quantum well barrier layer in the multi-quantum well active region adjacent to the band edge shaping layer changes; as a whole, the slope of the conduction band of the band edge shaping layer and the adjacent quantum well barrier layer becomes less steep and the effective potential barrier height is decreased, which is more favorable for the injection of carriers; as acted by the local built-in electric field, moreover, the position of electron ground state level of quantum wells at the side close to the band edge shaping layer relative to the quasi fermi level is also impacted. The first quantum well Q is observed, the position of electron ground state level in the quantum well is lower relative to the quasi fermi level, indicating that more electrons are captured by said quantum well and the carrier concentration in said quantum well is increased. The farther a quantum well is away from the band edge shaping layer, the weaker the impact of the local built-in electric field is and the less the electron ground state level in the quantum well is decreased relative to the quasi fermi level. This shows that relative to the structure prior to the optimization, the carrier distribution in the quantum well of the multi-quantum well active region in the light-emitting diode of this example is more uniform.

When the first band edge shaping layer 40*a* is introduced, the band edge shape of the energy band at the location between the band edge shaping layer and the electron blocking layer is trimmed through the local built-in electric field formed thereby such that the conduction band of said region is bent upwardly. On one hand, the conduction band of the electron blocking layer is raised relative to the quasi fermi level, its effective potential barrier height is raised and the carrier leakage is reduced; on the other hand, the upward bending of the energy band of said local region also raises the conduction band at the interface between the band edge shaping layer and the electron blocking layer relative to the quasi fermi level, and reduces the aggregation of electrons at this position.

Generally speaking, the preferred solution of this example achieves an advantageous effect equivalent to the combination of Example I and Example II.

Figure 14:
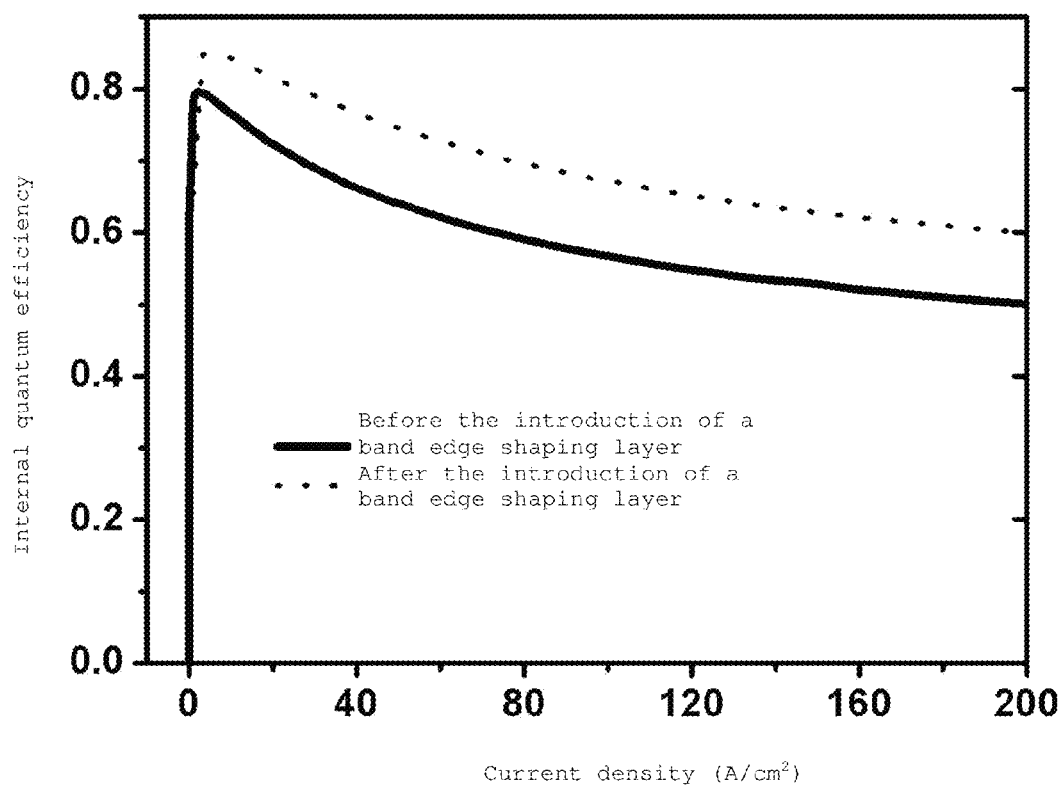
FIG. 14 illustrates the variation tendency of the internal quantum efficiency in the example in FIG. 12.

FIG. 14 illustrates the variation tendency of the internal quantum efficiency along with the current density in the preferred solution of this example. When changes of the internal quantum efficiency before and after the introduction of the band edge shaping layers are compared, it can be seen that the internal quantum efficiency of the device has been improved after the introduction of the band edge shaping layers, and the degree of the improvement of the internal quantum efficiency does not decrease along with the current increase.

EXAMPLE IV

Figure 15:
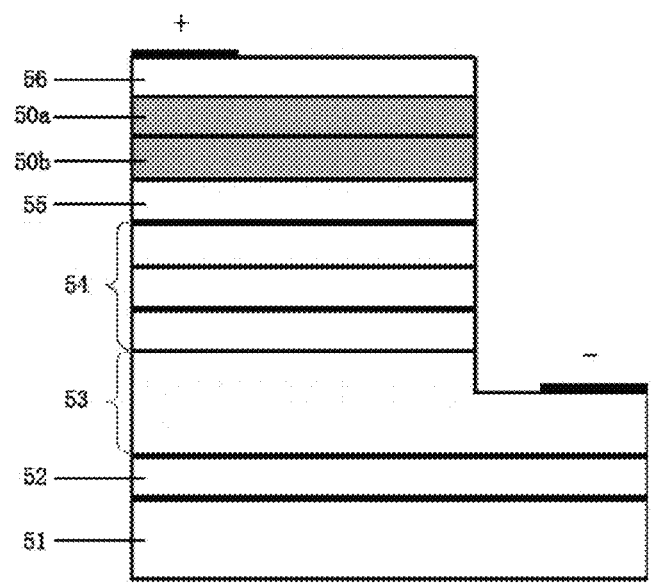
FIG. 15 illustrates the structure of a light-emitting diode in Example IV of the present invention.

As shown in FIG. 15, the epitaxial structure of the light-emitting diode comprises sequentially from bottom up: a substrate layer 51, a nucleation layer 52, a N-type electron injection layer 53, a multi-quantum well active region 54, an electron blocking layer 55, a second band edge shaping layer 50b, a first band edge shaping layer 50a and a P-type hole injection layer 56. Relative to the prior art, the first band edge shaping layer 50a and the second band edge shaping layer 50b are added between the electron blocking layer 55 and the P-type hole injection layer 56.

The thickness of the first band edge shaping layer 50a is 1 nm~100 nm, the material is N-type doped GaN, the doping concentration is $1\times10^{17}$ cm$^{-3}$~$1\times10^{19}$ cm$^{-3}$, and the dopant is SiH$_4$. In this example, a preferred selection is that the thickness of the first band edge shaping layer 50a is 20 nm and the doping concentration is $5\times10^{17}$ cm$^{-3}$.

The thickness of the second band edge shaping layer 50b is 1 nm~100 nm, the material is P-type doped GaN, the doping concentration is $1\times10^{17}$ cm$^{-3}$~$5\times10^{18}$ cm$^{-3}$, and the dopant is Cp$_2$Mg. In this example, a preferred selection is that the thickness of the second band edge shaping layer 50b is 20 nm and the doping concentration is $5\times10^{17}$ cm$^{-3}$.

The inventors have shown through actual tests that when the doping concentration is different and the thickness changes, the result is still optimized relative to not inserting said layer, but the effect is not as good as that of the above preferred solution.

Figure 16:
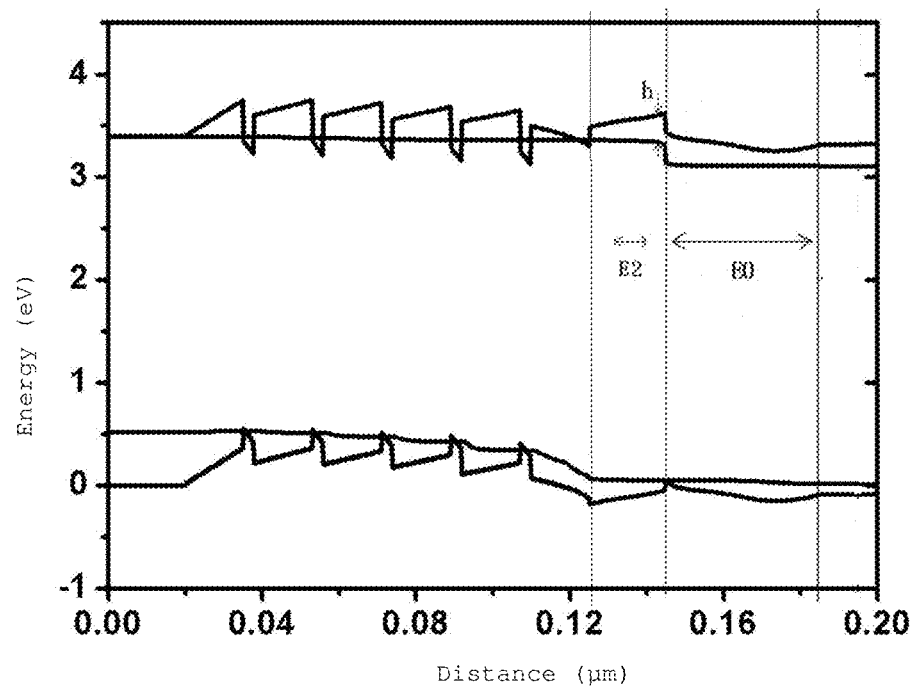
FIG. 16 illustrates the energy band structure of the example in FIG. 15.

FIG. 16 illustrates changes to the energy band structure when the preferred solution is selected in this example. In FIG. 3 and FIG. 16, E2 represents the energy band structure of the electron blocking layer, E0 in FIG. 16 represents the energy band structure of the first band edge shaping layer and the second band edge shaping layer. It can be seen by comparing the energy band structures in FIG. 3 and FIG. 16 that:

When the first band edge shaping layer and the second band edge shaping layer are introduced, the band edge shape of the energy band at the location between the second band edge shaping layer and the electron blocking layer is trimmed through the local built-in electric field formed thereby such that it is bent upwardly, as a result, the conduction band of the electron blocking layer is raised relative to the quasi fermi level, and its effective potential barrier height h is raised; the rise of the effective potential barrier height h leads to the reduced drain current (electron leakage herein) and the improved internal quantum efficiency of the device.

Figure 17:
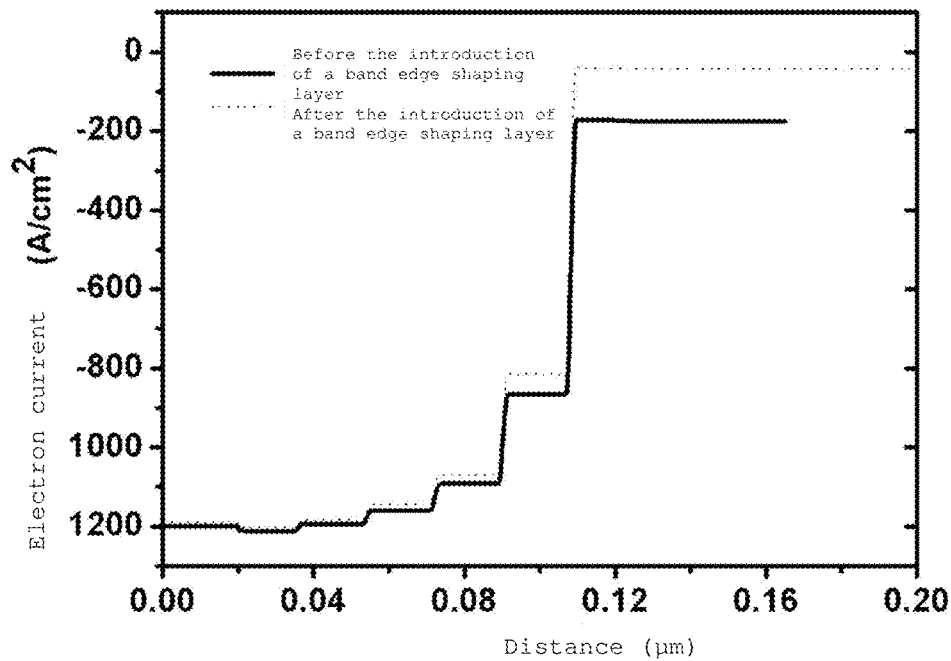
FIG. 17 illustrates the electron current distribution of the example in FIG. 15.

FIG. 17 illustrates changes of electron current along with the distance before and after the introduction of the band edge shaping layers in the preferred solution. It can be seen from the figure that after the introduction of the band edge shaping layers, the electron leakage of the new structure is reduced.

Figure 18:
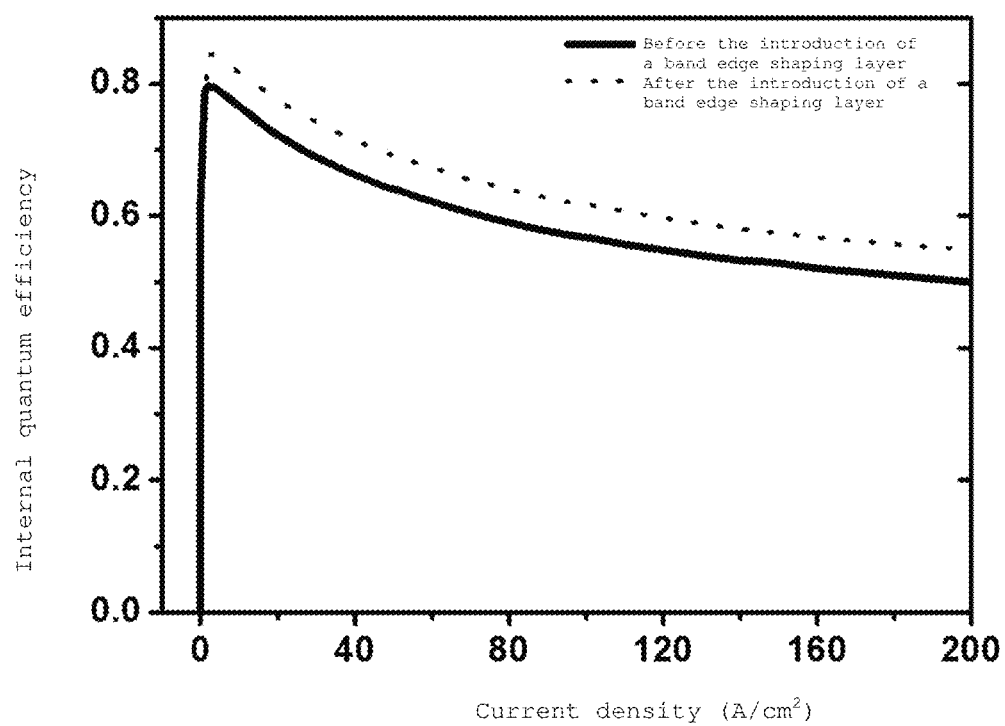
FIG. 18 illustrates the variation tendency of the internal quantum efficiency in the example in FIG. 15.

FIG. 18 illustrates the variation tendency of the internal quantum efficiency along with the current density in the preferred solution of this example. When changes of the internal quantum efficiency before and after the introduction of the band edge shaping layers are compared, it can be seen that the internal quantum efficiency of the device has been improved after the introduction of the band edge shaping layers, and the degree of the improvement of the internal quantum efficiency does not decrease along with the current increase.

In addition to the above Example I through Example IV, band edge shaping layers may be disposed inside multi-quantum well active region, and may also be disposed inside electron injection region or hole injection region. In the circumstance that a band edge shaping layers is disposed inside a multi-quantum well active region, in particular in the barrier layer: the band edge shaping layers is inserted at the position of the barrier layer in a multi-quantum well active region with non-uniform carrier distribution, the local band edge shape is trimmed and the difference between the ground state level of an adjacent quantum well thereof and the quasi fermi level is adjusted through the local built-in electric field formed as a result of adjusting the doping type, doping concentration and/or layer thickness thereof, thereby impacting the carrier concentration of the quantum well. The carrier distribution in a number of quantum wells becomes uniform by inserting band edge shaping layers at one or more locations of the multi-quantum well active region.

In the above Example I through Example IV, the listed band edge shaping layers use the material GaN. In fact, a band edge shaping layer may be of other types of semiconductor materials. Preferably, the material of a band edge shaping layer is consistent with the material of the adjacent layer to reduce the unfavorable impact as a result of lattice mismatch of the materials and to be more favorable for improving the internal quantum efficiency of the device.

The epitaxial structure according to the present invention may grow using chemical vapor deposition of metal organic compounds. Based on the above epitaxial structure, light-emitting diode chips are made through chip cutting.

According to the disclosure and teaching of the above description, those skilled in the art may make modifications and changes to the above embodiments. Therefore, the present invention is not limited to the specific embodiments disclosed and described above. Some modifications and amendments to the present invention shall be encompassed by the protection scope of the claims of the present invention.

The invention claimed is:

1. An epitaxial structure for semiconductor light-emitting device, characterized in that it comprises an electron injection region, a multi-quantum well active region and a hole injection region, as well as one or more band edge shaping layers; the doping type and/or doping concentration of said band edge shaping layers are different from those of the adjacent layers, said doping type being non-doping, P-type doping or N-type doping;

the band edge shaping layer trims the band edge shape of a semiconductor energy band of the epitaxial structure through the local built-in electric field formed as a result of adjusting the doping type, doping concentration and/or layer thickness thereof;

the band edge shaping layer is disposed between the electron injection region and the multi-quantum well active region to adjust the position of electron ground state level of quantum wells in the multi-quantum well active region relative to the quasi fermi level such that the carrier concentration in the quantum well layer inside the multi-quantum well active region is distributed uniformly and the overall Auger recombination is decreased;

when the band edge shaping layer is disposed between the electron injection region and the multi quantum well active region, the band edge shaping layer makes the electron ground state level of quantum wells in the multi-quantum well active region to be decreased relative to the quasi fermi level; and the farther a quantum well is away from the band edge shaping layer, the less its electron ground state level is decreased relative to the quasi fermi level.

2. The epitaxial structure as set forth in claim 1, characterized in that when there are a plurality of band edge shaping layers, they are disposed at both sides of the multi-quantum well active region at the same time, specifically: disposed between the electron injection region and the multi-quantum well active region and disposed together with the potential barrier layer for blocking carriers between the multi-quantum well active region and the hole injection region.

3. The epitaxial structure as set forth in claim 1, characterized in that when there are a plurality of band edge shaping layers, they are all disposed at the same side of the multi-quantum well active region, specifically: disposed between the multi-quantum well active region and the hole injection region, each band edge shaping layer having a different doping type, doping concentration and/or layer thickness.

4. A semiconductor light-emitting device made with said epitaxial structure as set forth in claim 1, characterized in that it at least comprises an electron injection region, a band edge shaping layer, a multi-quantum well active region and a hole injection region that are arranged sequentially.

5. A semiconductor light-emitting device made with said epitaxial structure as set forth in claim 1, characterized in that it at least comprises an electron injection region, a multi-quantum well active region, a band edge shaping layer, a potential barrier layer for blocking carriers and a hole injection region that are arranged sequentially.

6. A semiconductor light-emitting device made with said epitaxial structure as set forth in claim 2, characterized in that it comprises two band edge shaping layers, which are the first band edge shaping layer and the second band edge shaping layer, respectively; the epitaxial structure of said semiconductor light-emitting device at least comprises an electron injection region, the second band edge shaping layer, a multi-quantum well active region, the first band edge shaping layer, a potential barrier layer for blocking carriers and a hole injection region that are arranged sequentially.

7. A semiconductor light-emitting device made with said epitaxial structure as set forth in claim 3, characterized in that it comprises two band edge shaping layers, which are the first band edge shaping layer and the second band edge shaping layer, respectively; the first band edge shaping layer is N type doped and the second band edge shaping layer is P-type doped; the epitaxial structure of said semiconductor light emitting device at least comprises an electron injection region, a multi-quantum well active region, a potential barrier layer for blocking carriers, the second band edge shaping layer, the first band edge shaping layer and a hole injection region that are arranged sequentially.

* * * * *